(12) United States Patent
Nakayama et al.

(10) Patent No.: US 8,545,718 B2
(45) Date of Patent: Oct. 1, 2013

(54) WHOLLY AROMATIC THERMOTROPIC LIQUID-CRYSTAL POLYESTER RESIN COMPOSITION, MOLDED OBJECT, AND LED REFLECTOR

(75) Inventors: Toshio Nakayama, Tokyo (JP); Miyuki Shiraishi, Tokyo (JP)

(73) Assignee: JX Nippon Oil & Energy Corporation, Tokyo (JP)

( * ) Notice: Subject to any disclaimer, the term of this patent is extended or adjusted under 35 U.S.C. 154(b) by 0 days.

(21) Appl. No.: 13/260,815

(22) PCT Filed: Feb. 9, 2010

(86) PCT No.: PCT/JP2010/051879
§ 371 (c)(1),
(2), (4) Date: Dec. 16, 2011

(87) PCT Pub. No.: WO2010/113543
PCT Pub. Date: Oct. 7, 2010

(65) Prior Publication Data
US 2012/0097894 A1    Apr. 26, 2012

(30) Foreign Application Priority Data

Mar. 31, 2009   (JP) ................................ P2009-086200

(51) Int. Cl.
| | |
|---|---|
| C09K 19/52 | (2006.01) |
| C09K 19/06 | (2006.01) |
| C09K 19/54 | (2006.01) |
| C09K 19/02 | (2006.01) |
| G02F 1/1333 | (2006.01) |
| G02F 1/13 | (2006.01) |

(52) U.S. Cl.
USPC ............... 252/299.01; 252/299.5; 252/299.6; 428/1.1; 349/118; 349/167; 349/182; 349/193

(58) Field of Classification Search
USPC ............... 428/1.1; 252/299.01, 299.5, 299.6; 349/118, 167, 182, 193
See application file for complete search history.

(56) References Cited

U.S. PATENT DOCUMENTS

| | | | |
|---|---|---|---|
| 7,014,921 B2 * | 3/2006 | Okamoto et al. | 428/480 |
| 7,452,587 B2 | 11/2008 | Seino et al. | |
| 7,713,439 B2 * | 5/2010 | Murouchi et al. | 252/299.01 |
| 2007/0254150 A1 | 11/2007 | Seino et al. | |
| 2008/0032096 A1 | 2/2008 | Bourdelais et al. | |
| 2009/0250662 A1 | 10/2009 | Murouchi et al. | |

FOREIGN PATENT DOCUMENTS

| | | |
|---|---|---|
| CN | 1993424 | 7/2007 |
| CN | 101231349 | 7/2008 |
| JP | 6-38520 | 2/1994 |
| JP | 7-224208 | 8/1995 |
| JP | 7-224209 | 8/1995 |
| JP | 7-304935 | 11/1995 |
| JP | 8-165411 | 6/1996 |
| JP | 2002-294070 | 10/2002 |
| JP | 2003-195020 | 7/2003 |
| JP | 2004-363635 | 12/2004 |
| JP | 2006-257314 | 9/2006 |
| JP | 2007-254669 | 10/2007 |
| JP | 2008-231368 | 10/2008 |
| WO | 2007/111361 | 10/2007 |

OTHER PUBLICATIONS

International Preliminary Report on Patentability for PCT/JP2010/051879, mail date is Nov. 24, 2011.
Search report from International Application No. PCT/JP2010/051879, mail date is Apr. 6, 2010.
Office Action issued with respect to patent family member Chinese Patent Application No. 201080014834.8, mailed Sep. 20, 2012.
Office Action in Counterpart Application, CN Patent Application No. 201080014834.8, mailed on Apr. 28, 2013.

* cited by examiner

*Primary Examiner* — Geraldina Visconti
(74) *Attorney, Agent, or Firm* — Greenblum & Bernstein, P.L.C.

(57) ABSTRACT

A wholly aromatic thermotropic liquid-crystal polyester resin composition, comprising 5 to 40 parts by volume of titanium oxide (B) and 5 to 40 parts by volume of barium sulfate (C) with respect to 100 parts by volume of a wholly aromatic thermotropic liquid-crystal polyester (A); wherein the total of the (B) component and the (C) component with respect to 100 parts by volume of the (A) component is 15 to 45 parts by volume.

16 Claims, No Drawings

WHOLLY AROMATIC THERMOTROPIC LIQUID-CRYSTAL POLYESTER RESIN COMPOSITION, MOLDED OBJECT, AND LED REFLECTOR

TECHNICAL FIELD

The present invention relates to a wholly aromatic thermotropic liquid-crystal polyester resin composition, an injection-molded object thereof and an optical apparatus utilizing the molded object. Especially, the present invention relates to a molding material for a reflector of a light emitting apparatus, such as a Light Emission Diode element (hereinafter referred to as an "LED"), an LED reflector, etc., and, among others, to a wholly aromatic thermotropic liquid-crystal polyester resin composition to be utilized advantageously as a resin composition for molding a white LED reflector.

BACKGROUND ART

New light sources, such as an LED and an organic EL, have been recently increasing their demands as elements for illumination or display taking advantages of low power consumption and long life. Particularly, an LED has been used in various fields of electrical and electronic appliances, such as a mobile communication device like a cellular phone, etc., a display, an automobile instrument panel, a signal, and other home appliances. In such electrical and electronic appliances miniaturization is progressing more and more from the demand for better design, portability, etc. As a key technology for realizing such miniaturization, surface-mount technology (SMT) has gained popularity, and been utilized in many electrical and electronic appliances. According to the technology, the packaging density of an electronic substrate can be increased dramatically and such miniaturization as has been unattainable can now be realized.

For a manufacturing process applying the SMT, since the entire parts mounted on an electronic substrate are heated for soldering, only a material that is resistant to the soldering temperature (approximately 240° C.) can be used. Meanwhile, a trend toward a lead-free solder is going on recently from the environmental concern, and use of a tin-silver alloy, etc. has been started. The melting points of such lead-free solders are higher than those of conventional lead solders, and therefore the soldering temperature is getting higher (approximately 260° C.). An LED is no exception, and the heat resistance enduring the SMT is required. An LED module is generally constituted of a light emitting semiconductor part, a lead wire, a reflector functioning also as a housing, and a transparent sealant sealing the semiconductor, which are mounted onto a circuit pattern on a substrate with a conductive adhesive, a solder, etc. to an LED element and connected by wire bonding. Concerning the reflector part to be provided at the circumference of the LED element in order to increase the light utilization rate of the LED, products using a material such as a ceramic or a heat-resistant plastic have been commercialized. Since a ceramic has a productivity problem, an LED reflector using a resin, such as a heat-resistant plastic has been drawing attention.

A problem of the resin-made LED reflector is decrease in the light reflectance caused by discoloration of the resin due to heating or heat history during a manufacturing process of the LED module or under an actual application environment. For example, such heating takes place, as, in an injection molding step, 300 to 350° C. for several minutes; in a thermal curing step of a conductive adhesive or a sealant, 100 to 200° C. for several hours; and in a soldering step, in a case a lead-free solder (a tin-silver-copper alloy solder, etc.) is used according to SMT, a peak temperature of 260° C. or higher for several minutes. Since the light reflectance of an LED reflector has large influence on the light extraction efficiency, decrease in the light reflectance by 1 percentage point only cannot be neglected.

Further, since an LED reflector is generally a finely and complicatedly formed molded part in a size of about 1 to 2 mm, the material thereof requires good fabricability enabling reproduction of a desired form by injection molding, etc. Additionally, since the light reflectance may be deteriorated even by slight deformation of an LED reflector, the material therefor is required to be superior in mechanical strength and dimensional stability. Further, since it is occasionally exposed to high temperatures as described above, good heat resistance is also required. Meanwhile, such physical properties are also required with respect to a reflector for a light emitting apparatus other than an LED reflector.

Concerning a material for molding an LED reflector, various studies have been already conducted. For example, Patent Literature 1 listed below proposes a resin composition prepared by adding a glass fiber, and additionally titanium oxide according to need, to a melt processable polyester, such as an aromatic polyester and an aromatic polyester amide. Patent Literature 2 listed below proposes a resin composition for a reflective plate, prepared by adding a potassium titanate fiber and wollastonite to a semiaromatic polyamide, whose aromatic monomer content based on the total monomer components is 20 mol-% or more. Patent Literature 3 listed below proposes a material for a reflective plate for a UV ray emitting source composed of a thermoplastic resin and a compound containing a potassium titanate as an inorganic compound which can reflect visible light as well as UV rays. Patent Literature 4 listed below proposes a polyamide resin composition for molding an LED reflector, prepared by adding titanium oxide, and magnesium hydroxide to a certain polyamide resin. Patent Literature 5 listed below proposes a technology for manufacturing an LED reflector by injection-molding a resin composition containing a wholly aromatic thermotropic liquid-crystal polyester having good heat resistance and a white pigment.

Recently, owing to an invention of a white LED, its market has been growing rapidly in applications such as a liquid-crystal display panel and illumination. Concerning a white LED, there is currently no single light source type, and various types with combined light sources are known. For example, a type combining a plurality of LEDs, which can reproduce RGB colors, such as red (R; 630 nm), green (G; 525 nm), and blue (B; 470 nm), to synthesize a white color, and a type utilizing a wavelength conversion action by adding a fluorescent substance into a sealing resin, are known. As an LED utilizing a wavelength conversion, a type using as a light source an LED emitting near-ultraviolet to ultraviolet rays, which have a shorter wavelength than a conventional LED, is known (e.g. see Patent Literature 6). For such a reflector for a white LED, from a viewpoint of improvement of the brightness, high light reflectance not only for the vicinity of an average wavelength of 470 nm equivalent to the wavelength of a blue LED, but also for a shorter wavelength down to about 420 nm is required.

CITATION LIST

Patent Literature

Patent Literature 1: Japanese Examined Patent Application Publication No. Hei-06-38520

Patent Literature 2: Japanese Patent Laid-Open Publication No. 2002-294070
Patent Literature 3: Japanese Patent Laid-Open Publication No. 2003-195020
Patent Literature 4: Japanese Patent Laid-Open Publication No. 2006-257314
Patent Literature 5: Japanese Patent Laid-Open Publication No. 2007-254669
Patent Literature 6: Japanese Patent Laid-Open Publication No. 2004-363635

SUMMARY OF INVENTION

Technical Problem

Concerning the material according to Patent Literature 1, although the light reflectance has been studied with respect to a light wavelength range of 700 to 900 nm, the light reflectance with respect to a shorter wavelength range has not been studied. Titanium oxide, which is also described in Patent Literature 1, has a refractive index as high as 2.71, and has very high light reflectance with respect to a light wavelength range of 800 to 420 nm, and therefore is broadly used as a white pigment. With titanium oxide, however, its band gap structure at 3.2 eV absorbs light in a UV ray range, and consequently a reflector containing only titanium oxide tends to have insufficient light reflectance around 420 to 480 nm. Meanwhile, although in Patent Literature 1, as white pigments other than titanium oxide are named lithopone (mixed crystal of zinc sulfide and barium sulfate), zinc oxide, white lead (lead carbonate), barite (barium sulfate), etc., only the data indicating that their light reflectance at 700, 800, 900 nm is not better than titanium oxide are shown in Examples.

Although the light reflectance of the material according to Patent Literature 5 is studied at 480 nm, but the light reflectance in a shorter wavelength range has not been studied. Although it is conceivable that titanium oxide as a white pigment is filled at a higher concentration in order to improve further the light reflectance, a high-hardness material such as titanium oxide can cause coloration resulted from resin deterioration due to shear during compounding (adding and mixing), and eventually leads to inconveniences that the whiteness decreases and the light reflectance decreases. Further, it has become clear according to the study of the present inventors, that by high loading of titanium oxide, blistering or swelling can occur on a surface of a molded object at a high temperature of 260° C.

The materials according to Patent Literatures 2 to 4 do not have sufficient heat resistance yet as a resin composition for molding an LED reflector envisaging SMT. Further, a semi-aromatic polyamide has higher water absorption than a wholly aromatic thermotropic liquid-crystal polyester, and a productivity problem thereof is that fabrication requires troublesome works such as precise control of drying conditions.

As described above, although a conventional material for an LED reflector is on a level that can satisfy a part of the required physical properties, a problem thereof is that it cannot satisfy the other part of the physical properties.

In view of such circumstances, the present invention has been conducted with an object to provide a wholly aromatic thermotropic liquid-crystal polyester resin composition, that has high light reflectance with respect to light of a 420 nm wavelength, and can yield a molded object superior in heat resistance, a wholly aromatic thermotropic liquid-crystal polyester resin composition for molding an LED reflector, as well as a molded object produced using the same, and an LED reflector.

Solution to Problem

To solve the problem described above, the present inventors studied intensively to discover that a resin composition prepared by adding a titanium oxide particle and a barium sulfate particle to a wholly aromatic thermotropic liquid-crystal polyester at a specific volume ratio can be pelletized easily, has adequately high light reflectance with respect to light of 420 to 480 nm wavelength, and can produce an injection molded object, on which no or little blistering or swelling appears even under such severe heating conditions as 260° C. for 30 min, thereby completing the present invention.

A first wholly aromatic thermotropic liquid-crystal polyester resin composition according to the present invention comprises 5 to 40 parts by volume of titanium oxide (B) and 5 to 40 parts by volume of barium sulfate (C) with respect to 100 parts by volume of a wholly aromatic thermotropic liquid-crystal polyester (A); wherein the total of the (B) component and the (C) component with respect to 100 parts by volume of the (A) component is 15 to 45 parts by volume.

A second wholly aromatic thermotropic liquid-crystal polyester resin composition according to the present invention comprises 5 to 40 parts by volume of titanium oxide (B), 5 to 40 parts by volume of barium sulfate (C), and 1 to 15 parts by volume of glass fiber (D) with respect to 100 parts by volume of a wholly aromatic thermotropic liquid-crystal polyester (A); wherein the total of the (B) component, the (C) component, and (D) component with respect to 100 parts by volume of the (A) component is 15 to 45 parts by volume.

With the first and second wholly aromatic thermotropic liquid-crystal polyester resin composition according to the present invention, an injection molded object superior in both light reflectance in a short wavelength range and heat resistance can be produced at high productivity. The second wholly aromatic thermotropic liquid-crystal polyester resin composition according to the present invention can exert by containing a glass fiber at an afore-described certain voluminal ratio, in addition to the above effects, an effect thereof is that a molded object further superior in mechanical strength and dimensional stability can be yielded. A resin composition according to the present invention is useful as a light reflector material, especially as a material for molding an LED reflector.

The present inventors believe that the afore-described effects according to the present invention are attributable to: resin deterioration by shear during compounding can be suppressed by adding titanium oxide with high Mohs hardness (approx. 7) and barium sulfate with low Mohs hardness (3 to 3.5) at a certain ratio to a wholly aromatic thermotropic liquid-crystal polyester, and thus the light reflectance in a short wavelength range can be enhanced effectively without compromising the advantageous physical property pertaining to the wholly aromatic thermotropic liquid-crystal polyester.

According to the present invention, a resin composition satisfying adequately required levels of physical properties with respect to light reflectance, whiteness, moldability, mechanical strength, dimensional stability, heat resistance and hygroscopicity, and maintaining high whiteness without discoloration even after exposure to a high temperature, can be provided.

With respect to the second wholly aromatic thermotropic liquid-crystal polyester resin composition according to the present invention, the fiber length of the (D) component is preferably in the range of 0.1 to 3 mm.

With respect to the first and second wholly aromatic thermotropic liquid-crystal polyester resin composition according to the present invention, preferably the primary particle size of the (B) component is in the range of 0.2 to 0.3 μm, and the primary particle size of the (C) component is in the range of 0.1 to 10 μm.

The melting point of the (A) component is preferably 320° C. or higher.

With respect to the first and second wholly aromatic thermotropic liquid-crystal polyester resin composition according to the present invention, the light reflectance with respect to light of a 420 nm wavelength at a molded surface of an injection-molded object thereof is preferably 70% or higher.

The present invention provides also a molded object composed of the first and second wholly aromatic thermotropic liquid-crystal polyester resin composition according to the present invention.

The present invention provides also an LED reflector composed of the first and second wholly aromatic thermotropic liquid-crystal polyester resin composition according to the present invention.

The present invention provides also a wholly aromatic thermotropic liquid-crystal polyester resin composition for molding an LED reflector, the composition comprising 5 to 40 parts by volume of titanium oxide (B), 5 to 40 parts by volume of barium sulfate (C), and 1 to 15 parts by volume of glass fiber (D) with respect to 100 parts by volume of a wholly aromatic thermotropic liquid-crystal polyester (A);

wherein the total of the (B) component, the (C) component, and the (D) component with respect to 100 parts by volume of the (A) component is 15 to 45 parts by volume;

the primary particle size of the (B) component is in the range of 0.2 to 0.3 μm, the primary particle size of the (C) component is in the range of 0.1 to 10 μm, and the fiber length of the (D) component is in the range of 0.1 to 3 mm; and the light reflectance with respect to light of a 420 nm wavelength at a molded surface of an injection-molded object thereof is 70% or higher.

With respect to the wholly aromatic thermotropic liquid-crystal polyester resin composition for molding an LED reflector according to the present invention, the melting point of the (A) component is preferably 320° C. or higher.

The present invention provides also an LED reflector composed of the wholly aromatic thermotropic liquid-crystal polyester resin composition for molding an LED reflector according to the present invention.

Advantageous Effects of Invention

The present invention can provide, without compromising the superior heat resistance and moldability of a wholly aromatic thermotropic liquid-crystal polyester, a resin composition yielding a molded object having superior light reflectance and mechanical strength. By injection-molding the resin composition and using a surface of the injection-molded object as a reflection surface, a reflector superior in light reflectance and heat resistance, especially a reflector superior in light reflectance for light of short wavelength, suitable for a white LED can be produced.

DESCRIPTION OF EMBODIMENTS (With Respect to Wholly Aromatic Thermotropic Liquid-Crystal Polyester (A))

Examples of a wholly aromatic thermotropic liquid-crystal polyester to be used according to the present invention (hereinafter occasionally called simply as "LCP") include a derivative of a combination of an aromatic dicarboxylic acid, an aromatic diol and an aromatic hydroxycarboxylic acid, a derivative of different aromatic hydroxycarboxylic acids, a derivative of a combination of an aromatic dicarboxylic acid and an aromatic diol, and a reaction product of a polyester such as polyethylene terephthalate with an aromatic hydroxycarboxylic acid.

The melting point of a wholly aromatic thermotropic liquid-crystal polyester to be used according to the present invention is preferably 320° C. or higher. By adding such LCP, an LED reflector superior in heat resistance such as resistance to soldering heat can be realized more effectively.

To obtain a wholly aromatic thermotropic liquid-crystal polyester having a melting point of 320° C. or higher, p-hydroxybenzoic acid should be preferably used as a source monomer at 40 mol-% or higher. Additionally, another known aromatic hydroxycarboxylic acid, aromatic dicarboxylic acid, and aromatic dihydroxy compound may be used in an appropriate combination thereof. Preferable examples include a polyester to be obtained from only aromatic hydroxycarboxylic acid(s), such as p-hydroxybenzoic acid and 2-hydroxy-6-naphthoic acid, and a liquid-crystal polyester to be obtained from the aromatic hydroxycarboxylic acid(s), as well as an aromatic dicarboxylic acid, such as terephthalic acid, isophthalic acid and 2,6-naphthalene dicarboxylic acid, and/or an aromatic dihydroxy compound, such as hydroquinone, resorcinol, 4,4'-dihydroxydiphenyl and 2,6-dihydroxynaphthalene.

Especially preferably can be named a wholly aromatic thermotropic liquid-crystal polyester to be manufactured by polycondensation of 80 to 100 mol-% of p-hydroxybenzoic acid (a), terephthalic acid (b), and 4,4'-dihydroxybiphenyl (c) (including a derivative thereof), (provided that the total of (a) and (b) is 60 mol-% or higher), and 0 to 20 mol-% of another aromatic compound, which is able to polycondense with any of (a), (b) and (c).

In order to mitigate the influence of the heat history in a production process of a wholly aromatic thermotropic liquid-crystal polyester by reducing the melt polycondensation time, it is preferable to acetylate in advance hydroxy groups in the monomer, then to conduct the melt polycondensation. For the sake of a simple process procedure, the acetylation is preferably carried out by feeding acetic anhydride into the monomers in a reactor, and the acetylation step is preferably carried out in the same reactor as for the melt polycondensation step. In other words, preferably the acetylation reaction of a source monomer is conducted with acetic anhydride in a reactor, and after the completion of the reaction the temperature is raised to move to a polycondensation reaction.

The acetylated monomer can be subjected to a melt polycondensation reaction involving deacetylation. As for a reactor, use of a reactor provided with a monomer feeding unit, an acetic acid discharging unit, a molten polyester recovering unit and a stirring unit is preferable. Such a reactor (a polycondensation apparatus) can be selected appropriately among those known. The polymerization temperature is preferably 150° C. to 350° C. After the completion of the acetylation reaction, preferably the temperature is raised to a polymerization initiation temperature to start polycondensation, and then further raised at a rate in the range of 0.1° C./min to 2°

C./min up to a final temperature of 280 to 350° C. As described above, the polycondensation temperature is preferably increased keeping step with the increase of the melt temperature of the yielded polymer in progress of polycondensation. In the polycondensation reaction, a catalyst known as a polycondensation catalyst for a polyester may be used. Examples of the catalyst include a metal catalyst, such as magnesium acetate, stannous acetate, tetrabutyl titanate, lead acetate, sodium acetate and potassium acetate, and an organic compound catalyst such as N-methylimidazole.

During the melt polycondensation, a wholly aromatic thermotropic liquid-crystal polyester at a low degree of polymerization is recovered from the reactor in a molten phase, when the pour point reaches 200° C. or higher, preferably 220° C. to 330° C., and sent to a cooling machine, such as a steel belt and a drum cooler, to chill the same to solidify.

Then the solidified wholly aromatic thermotropic liquid-crystal polyester with a low degree of polymerization is crushed to a size suitable for the following solid phase polycondensation reaction. Although there is no particular restriction on the crushing method, preferable examples include methods using apparatus, e.g. an impact mill, such as Feather Mill, Victory mill, Coloplex, a pulverizer, Contraplex, Scroll mill, and ACM pulverizer manufactured by Hosokawa Micron Corp., and Roll Granulator, which is a bridged particle cracking roller mill manufactured by Matsubo Corp. Especially, preferable is a method using Feather Mill manufactured by Hosokawa Micron Corp. Although there is no particular restriction on the particle size of the crushed product according to the present invention, a range of passing through 4 mesh to retained on 2-000 mesh by an industrial sifter (Tyler mesh) is preferable, a range of 5 mesh to 2000 mesh (0.01 to 4 mm) is more preferable, and a range of 9 mesh to 1450 mesh (0.02 to 2 mm) is most preferable.

Next, the crushed product yielded at the crushing step is forwarded to a solid phase polycondensation step to carry out solid phase polycondensation. There is no particular restriction on an apparatus and operation conditions to be applied to the solid phase polycondensation step, and a known apparatus and procedure can be used. For the use as an LED reflector, the solid phase polycondensation reaction is preferably continued until a wholly aromatic thermotropic liquid-crystal polyester having a melting point of 320° C. or higher can be obtained.

From a viewpoint of productivity (compounding), the apparent viscosity of the wholly aromatic thermotropic liquid-crystal polyester (A) is preferably 10 to 300 Pa·S.

The content of the wholly aromatic thermotropic liquid-crystal polyester (A) in the resin composition is preferably 70 to 85% by volume based on the total amount of the resin composition.

(With Respect to Titanium Oxide (B))

The titanium oxide to be used according to the present invention means $TiO_2$ and is broadly used as a white pigment. As the titanium oxide a rutile-type titanium dioxide particle, which is stable even at a high temperature and high light screening power, is preferable. The primary (number average) particle size of the titanium oxide particle is preferably 0.1 to 0.5 μm, and more preferably 0.2 to 0.3 μm. In a case the primary number average particle size is in the range, the light scattering power is high, the light reflectance at a molded surface of a molded object is enhanced, and the same with high brightness can be obtained easier. In a case the particle size is less than 0.1 μm, the light scattering power becomes low and the brightness of the molded surface decreases. In a case the particle size exceeds 0.5 μm, the dispersion of the titanium oxide particle in a resin (LCP) tends to become poor, which is unfavorable in attempting higher loading from a viewpoint of the working performance.

The content of the titanium oxide (B) in a resin composition is 5 to 40 parts by volume, and preferably 10 to 30 parts by volume, with respect to 100 parts by volume of the wholly aromatic thermotropic liquid-crystal polyester (A). In a case the content of the titanium oxide (B) is less than the lower limit, the whiteness tends to become insufficient. On the other hand, in a case it exceeds the upper limit, the heat resistance of a molded object to be obtained by injection-molding the resin composition becomes insufficient and a risk of swelling after a heat treatment increases, which tend to make it difficult to use the same for a reflector part application requiring good molded surfaces.

(With Respect to Barium Sulfate (C))

Barium sulfate to be used according to the present invention means an ionic crystal compound represented by $BaSO_4$, and is broadly used as a paint, an ink, an additive for a plastic and a white pigment. The barium sulfate may be a crushed powder of natural barite, or sedimentary barium sulfate produced via a chemical reaction. Preferably a barium sulfate with a primary (number average) particle size of 0.1 to 30 μm is used, and more preferably a barium sulfate of 0.1 to 10 μm is used. In a case the primary number average particle size is in the range, the light scattering power becomes high, and a molded object with enhanced light reflectance at a molded surface can be obtained easier. In a case the particle size is less than 0.1 μm, the light scattering power becomes low and the brightness of the molded surface may result in decrease, and in a case the particle size exceeds 30 μm, the dispersion of the barium sulfate particle in a resin (LCP) becomes extremely poor, which is not preferable also from a viewpoint of the working performance.

As the barium sulfate, a commercial product may be used. Examples of a commercial product include "300" manufactured by Sakai Chemical Industry Co., Ltd. (sedimentary barium sulfate, primary number average particle size: 0.7 μm), "BMH-100" manufactured by Sakai Chemical Industry Co., Ltd. (sedimentary barium sulfate, primary number average particle size: 10 μm), and "W-1" manufactured by Takehara Kagaku Kogyo Co., Ltd. (Ground barite barium sulfate, primary number average particle size: 1.5 μm).

The content of the barium sulfate (C) in a resin composition is 5 to 40 parts by volume, and preferably 10 to 30 parts by volume, with respect to 100 parts by volume of the wholly aromatic thermotropic liquid-crystal polyester (A). In a case the content of the barium sulfate (C) is less than the lower limit, the light reflectance improvement effect in a short wavelength range tends to become insufficient. On the other hand, in a case it exceeds the upper limit, the heat resistance of a molded object to be obtained by injection-molding the resin composition becomes insufficient and a risk of swelling after a heat treatment increases, which tend to make it difficult to use the same for a reflector part application requiring good molded surfaces.

In a resin composition according to the present invention the total content of the (B) component and the (C) component with respect to 100 parts by volume of the (A) component is 15 to 45 parts by volume. In a case the total content is less than the lower limit, good whiteness cannot be available, and in a case it exceeds the upper limit, the fluidity of the resin composition decreases and compounding (adding and mixing) becomes difficult, and thus a homogeneous resin composition becomes unavailable.

(With Respect to Glass Fiber (D))

As a glass fiber to be used according to the present invention those commonly utilized as a resin reinforcement, such as a chopped strand and a milled fiber, can be favorably utilized, but a chopped strand is preferable. The fiber length of a usable glass fiber, in a number average length, is 100 μm to 10 mm, preferably 200 μm to 5 mm, and more preferably 0.1 mm to 3 mm. The thickness of a glass fiber, in a number average diameter, is preferably 5 to 20 μm from a viewpoint of the fluidity at injection-molding, and more preferably, in a number average diameter, 7 to 15 μm. Preferable specific examples of a glass fiber include "PX-1" manufactured by Owens Corning Japan Ltd. (number average fiber diameter: 10 μm, number average fiber length: 3 mm).

The content of the glass fiber (D) is 0 to 15 parts by volume with respect to 100 parts by volume of the wholly aromatic thermotropic liquid-crystal polyester (A). In a case it exceeds the upper limit, the contents of the wholly aromatic thermotropic liquid-crystal polyester (A) and/or the titanium oxide (B) particle and/or the barium sulfate (C) particle decreases relatively and the moldability and/or the light reflectance and whiteness of the resulted resin composition tends to become insufficient.

In a case a resin composition according to the present invention contains the glass fiber (D), the content thereof is 1 to 15 parts by volume with respect to 100 parts by volume of the wholly aromatic thermotropic liquid-crystal polyester (A). In this case, the total content of the (B) component, the (C) component and the (D) component with respect to 100 parts by volume of the (A) component is preferably 15 to 45 parts by volume. In a case the total content is less than the lower limit, the reinforcing effect cannot be obtained sufficiently, and in a case it exceeds the upper limit, the fluidity of the resin composition decreases and compounding (adding and mixing) becomes difficult, and thus a homogeneous resin composition becomes unavailable.

Into a resin composition according to the present invention, 1 or 2 or more kinds of various kinds of additives may be added insofar as the object of the present invention should not be compromised. Examples of the additives include a fibrous inorganic filler, such as wollastonite, and a potassium titanate fiber, a powdery or an acicular inorganic filler, such as silica, talc, and potassium titanate whiskers, and another common additive, such as an antioxidant and thermal stabilizer (e.g. hindered phenol, hydroquinone, phosphites and derivatives thereof), an ultraviolet absorber (e.g. a resorcinol, a salicylate, a benzotriazole, and a benzophenone), a lubricant and mold lubricant (a montanoic acid and a salt, an ester, and a half ester thereof, stearyl alcohol, a stearamide, and a polyethylene wax, etc.), a plasticizer, an antistatic agent, and a flame retardant, and another thermoplastic resin. By adding any of the above additives, a desired property may be added to the resin composition.

The light reflectance with respect to light of a 420 nm wavelength at a molded surface of a molded object manufactured by injection-molding the resin composition according to the present invention is preferably 60% or higher, and more preferably 70% or higher. More specifically, the light reflectance with respect to a 420 nm wave (relative reflectance based on 100% of the diffuse reflectance of a barium sulfate standard white board) at a surface of a 1 mm-thick or 3 mm-thick flat plate specimen prepared by injection-molding using a standard mold (e.g., 60 mm (width)×60 mm (length)× 1.0 mm (thickness), or 60 mm (width)×60 mm (length)×3.0 mm (thickness)), and under standard conditions (e.g., maximum cylinder temperature: 350° C., injection speed: 100 mm/sec, mold temperature: 80° C.) is preferably 60% or higher and more preferably 70% or higher. In a case the reflectance is less than the lower limit, a molded object to be obtained from the resin composition may not be able to satisfy the light beam reflecting performance required for a reflector any more. Especially, it is preferable for the sake of further miniaturization with ease of an LED module and the like, that the surface of the 1 mm-thick flat plate specimen can satisfy the above range.

A wholly aromatic thermotropic liquid-crystal polyester resin composition according to the present invention can be used favorably as a wholly aromatic thermotropic liquid-crystal polyester resin composition for molding an LED reflector.

(With Respect to Production Method of Wholly Aromatic Thermotropic Liquid-Crystal Polyester Resin Composition)

A wholly aromatic thermotropic liquid-crystal polyester resin composition according to the present invention can be produced by melt-kneading the afore-described respective components (a wholly aromatic thermotropic liquid-crystal polyester, a titanium oxide particle, a barium sulfate particle, and a glass fiber according to need). As an apparatus for melt-kneading, a twin screw kneader may be used. More preferable is a continuous extrusion twin screw kneader having a pair of double thread screws, and among others especially preferable is a co-rotational type with an inverting mechanism enabling uniform dispersion of filling materials. Using a machine having a cylinder diameter of 40 mmφ or larger, with a large gap between the barrel and the screw allowing easy entry of filling materials, with a large inter-screw gap, with a contact ratio of 1.45 or higher, and with capability for feeding a filler in the middle of the cylinder, a resin composition according to the present invention can be produced efficiently. It is preferable that the machine to be used should be provided with equipment for feeding at least a part of a glass fiber into the middle of the cylinder.

Preferably, a wholly aromatic thermotropic liquid-crystal polyester, a titanium oxide particle, and a barium sulfate particle are mixed using known solid mixing equipment, such as a ribbon blender, a tumbler blender, or a Henschel mixer, dried according to need by a hot air dryer, or a vacuum dryer, etc., and fed from a hopper of a twin screw kneader.

In producing a resin composition containing a glass fiber, at least a part of a glass fiber to be mixed should preferably be fed into the middle of the cylinder of a twin screw kneader (so-called side-feed). This tends to improve the mechanical strength of a weld part of a molded object obtained by injection-molding the resulted resin composition, compared to the case, in which the entire glass fiber is fed together with other source materials from a hopper (so-called top-feed). The portion of the side-fed amount based on the entire glass fiber amount to be mixed is preferably 50% or higher, and most preferably 100%. In a case the side-fed portion is less than the lower limit, compounding (adding and mixing) tends to become difficult, and thus a homogeneous resin composition becomes unavailable.

(With Respect to Molded Object and LED Reflector)

A molded object according to the present invention is prepared by molding the afore-described wholly aromatic thermotropic liquid-crystal polyester resin composition according to the present invention. As for a molding process, among injection molding, extrusion molding, press molding, etc., injection-molding using an injection-molding machine is preferable from viewpoints of easiness in molding, mass productivity, cost, etc. For example, in a case a pelletized wholly aromatic thermotropic liquid-crystal polyester resin composition according to the present invention is injection-molded and a surface of the injection-molded object is used as a reflection surface, an LED reflector superior in light reflectance and heat resistance, especially an LED reflector suitable for a white LED superior in the light reflectance with respect to short wavelength light can be obtained.

EXAMPLES

The present invention will be described below more particularly in reference to Examples, provided that the present invention be not limited to the Examples.

Firstly, a production example of a wholly aromatic thermotropic liquid-crystal polyester is described below.

Production Example 1

Production of Wholly Aromatic Thermotropic Liquid-Crystal Polyester (I)

Into a polymerization reactor (manufactured by Kobe Steel, Ltd.) with a internal volume of 1700 L using the material of SUS 316, having a double helical stirrer blade, 240 kg (1.74 kmol) of p-hydroxybenzoic acid (manufactured by Ueno Fine Chemicals Industry, Ltd.), 108 kg (0.58 kmol) of 4,4'-dihydroxybiphenyl (manufactured by Honshu Chemical Industry Co., Ltd.), 72 kg (0.44 kmol) of terephthalic acid (manufactured by Mitsui Chemicals, Inc.), 24 kg (0.15 kmol) of isophthalic acid (manufactured by A. G. International Chemical Co., Inc.), and as catalysts 0.03 kg of potassium acetate (manufactured by Kishida Chemical Co., Ltd.), and 0.09 kg of magnesium acetate (manufactured by Kishida Chemical Co., Ltd.) were charged, and after nitrogen replacement of the polymerization reactor by repeating twice evacuation and nitrogen injection, 311 kg (3.05 kmol) of acetic anhydride was further added, and the mixture was heated to 150° C. over 1.5 hours with the stirrer blade rotating at 45 rpm to carry out an acetylation reaction at reflux for 2 hours.

After the completion of the acetylation, the polymerization reactor set under the conditions for distilling off acetic acid was heated at a rate of 0.5° C./min, and when the reactor temperature reached 310° C., the polymerization product was recovered from an outlet at the reactor bottom, and chilled by a cooling apparatus to solidify. The obtained polymerization product was crushed by a crusher manufactured by Hosokawa Micron Corp. to a size passing a sieve with an opening of 2.0 mm to yield a prepolymer.

Next, the prepolymer yielded as above was filled in a rotary kiln manufactured by Takasago Industry Co., Ltd., which was then swept with nitrogen at a flow rate of 16 Nm$^3$/hr, and the heater temperature was raised from room temperature to 170° C. over 3 hours at a rotation speed of 2 rpm, then raised to 280° C. over 5 hours, and further to 300° C. over 3 hours to conduct a solid phase polycondensation. Thus about 400 kg of a powdery wholly aromatic thermotropic liquid-crystal polyester (I) was obtained. The melting point of the obtained wholly aromatic thermotropic liquid-crystal polyester (I) was 352° C. and the apparent viscosity thereof was 70 Pa·S.

Production Example 2

Production of Wholly Aromatic Thermotropic Liquid-Crystal Polyester (II)

Into a polymerization reactor (manufactured by Kobe Steel, Ltd.) with an internal volume of 1700 L using the material of SUS 316, having a double helical stirrer blade, 240 kg (1.74 kmol) of p-hydroxybenzoic acid (manufactured by Ueno Fine Chemicals Industry, Ltd.), 108 kg (0.58 kmol) of 4,4'-dihydroxybiphenyl (manufactured by Honshu Chemical Industry Co., Ltd.), 58 kg (0.35 kmol) of terephthalic acid (manufactured by Mitsui Chemicals, Inc.), 39 kg (0.23 kmol) of isophthalic acid (manufactured by A. G. International Chemical Co., Inc.), and as catalysts 0.03 kg of potassium acetate (manufactured by Kishida Chemical Co., Ltd.), and 0.09 kg of magnesium acetate (manufactured by Kishida Chemical Co., Ltd.) were charged, and after nitrogen replacement by repeating twice evacuation and nitrogen injection, 311 kg (3.05 kmol) of acetic anhydride was further added, and prepolymer was yielded according to similar procedures as for the wholly aromatic thermotropic liquid-crystal polyester (I).

The prepolymer yielded as above was filled in a rotary kiln manufactured by Takasago Industry Co., Ltd., which was then swept with nitrogen at a flow rate of 16 Nm$^3$/hr, and the heater temperature was raised from room temperature to 170° C. over 3 hours at a rotation speed of 2 rpm, then raised to 280° C. over 5 hours, and further to 280° C. over 3 hours to conduct a solid phase polycondensation. Thus about 400 kg of a powdery wholly aromatic thermotropic liquid-crystal polyester (II) was obtained. The melting point of the obtained wholly aromatic thermotropic liquid-crystal polyester (II) was 320° C. and the apparent viscosity thereof was 70 Pa·S.

(Titanium Oxide Particle)

As a titanium oxide particle, "SR-1" (trade name) manufactured by Sakai Chemical Industry Co., Ltd. (primary number average particle size: 0.25 μm) was arranged.

(Barium Sulfate Particle)

As a barium sulfate particle (I), "300" (trade name) manufactured by Sakai Chemical Industry Co., Ltd. (primary number average particle size: 0.7 μm) was arranged. Further, as a barium sulfate particle (II), "BMH-100" (trade name) manufactured by Sakai Chemical Industry Co., Ltd. (primary number average particle size: 10 μm) was arranged.

(Glass Fiber)

"PX-1" manufactured by Owens Corning Japan Ltd. (number average length: 3 mm, number average diameter: 10 μm) was used.

Production of Resin Composition

Example 1

With 100 parts by volume of the wholly aromatic thermotropic liquid-crystal polyester (I), 12.5 parts by volume of the titanium oxide particle and 12.5 parts by volume of the barium sulfate particle (I) were mixed in advance using a ribbon blender, and the mixture was dried in an air oven at 150° C. for 2 hours. The dried mixture was melt-kneaded in a twin screw extruder ("KTX-46" manufactured by Kobe Steel, Ltd.), which cylinder was set at a maximum temperature of 380° C., at an extrusion speed of 180 kg/hr to yield pellets of a wholly aromatic thermotropic liquid-crystal polyester resin composition.

Examples 2 to 4

Pellets of wholly aromatic thermotropic liquid-crystal polyester resin compositions were yielded separately by the same equipment and operation procedures as in Example 1, except that the respective components were mixed according to the compositions shown in Table 1 (the compositions in the table are expressed in parts by volume).

Example 5

Except that the respective components were mixed according to the composition shown in Table 1 (the compositions in the table are expressed in parts by volume), a dried mixture was obtained by the same equipment and operation procedures as in Example 1. The mixture was supplied to a hopper of a twin screw extruder ("KTX-46" manufactured by Kobe Steel, Ltd.), which cylinder was set at a maximum temperature of 380° C., and 14.3 parts by volume of a glass fiber was fed into the middle of the cylinder of the twin screw extruder (side-feed) by adjusting a feeder, and the mixture was melt-kneaded at an extrusion speed of 180 kg/hr to yield pellets of the wholly aromatic thermotropic liquid-crystal polyester resin composition. In this connection, the location of the side-feed of the glass fiber at the cylinder of the twin screw extruder was selected at a location 50% of the length between the installed location of the hopper at the cylinder and the front end of the cylinder from the installed location of the hopper toward the front end of the cylinder.

Examples 6 and 7

Pellets of wholly aromatic thermotropic liquid-crystal polyester resin compositions were yielded separately by the same equipment and operation procedures as in Example 1, except that the wholly aromatic thermotropic liquid-crystal polyester (II) was used instead of the wholly aromatic thermotropic liquid-crystal polyester (I), and that the respective components were mixed according to the compositions shown in Table 1.

Comparative Examples 1 and 2

Pellets of wholly aromatic thermotropic liquid-crystal polyester resin compositions were yielded separately by the same equipment and operation procedures as in Example 1, except that the respective components were mixed according to the compositions shown in Table 1 (the compositions in the table are expressed in parts by volume).

Comparative Example 3

It was tried to yield pellets of wholly aromatic thermotropic liquid-crystal polyester resin compositions by the same equipment and operation procedures as in Example 5, except that the respective components were mixed according to the composition shown in Table 1 (the compositions in the table are expressed in parts by volume), but pellets could not be yielded.

Comparative Example 4

It was tried to yield pellets of wholly aromatic thermotropic liquid-crystal polyester resin compositions by the same equipment and operation procedures as in Example 1, except that the respective components were mixed according to the composition shown in Table 1 (the compositions in the table are expressed in parts by volume), but pellets could not be yielded.

Comparative Example 5

Pellets of wholly aromatic thermotropic liquid-crystal polyester resin compositions were yielded by the same equipment and operation procedures as in Example 1, except that the respective components were mixed according to the composition shown in Table 1 (the compositions in the table are expressed in parts by volume).

(Preparation of Test Specimens by Injection-Molding)

The pellets of resin compositions yielded according to the above Examples and Comparative Examples were injection-molded by using an injection-molding machine ("UH-1000", manufactured by Nissei Plastic Industrial Co., Ltd.) with a maximum cylinder temperature of 350° C., at an injection speed of 100 mm/sec, at a mold temperature of 80° C. to 2 each of injection-molded flat plates of 60 mm (width)×60 mm (length)×1.0 mm (thickness), one of which was used as a test specimen for light reflectance, and the other was used as a test specimen for evaluation of blistering property.

The values of physical properties shown in Examples were measured by the following methods.

(Melting Point)

The melting point of a wholly aromatic thermotropic liquid-crystal polyester was measured by a differential scanning calorimeter (manufactured by SEICO Electronics Industrial Co., Ltd.) using α-alumina as a reference. In this case the temperature was raised from room temperature to 400° C. at a temperature increase rate of 20° C./min to melt completely the polymer, then lowered to 150° C. at a rate of 10° C./min, and raised again to 420° C. at a rate of 20° C./min to give an endothermic peak, the top of which was determined as the melting point.

(Apparent Viscosity)

The apparent viscosity of a wholly aromatic thermotropic liquid-crystal polyester was measured by using a capillary rheometer (Model 2010, manufactured by INTESCO Co., Ltd.) with a capillary of a diameter of 1.0 mm, a length of 40 mm, and an entry angle of 90°. Conducting constant rate heating at an increase rate of +4° C./min from a temperature 30° C. below the melting point determined by DSC, apparent viscosities were measured at a shear rate of 100 $sec^{-1}$ to determine the apparent viscosity at a predetermined temperature.

(Melt Viscosity)

With respect to the melt viscosity of a wholly aromatic thermotropic liquid-crystal polyester resin composition, a capillary rheometer ("2010", manufactured by INTESCO Co., Ltd.) with a capillary of a diameter of 1.00 mm, a length of 40 mm, and an entry angle of 90° was used at a shear rate of 100 $sec^{-1}$, conducting constant rate heating at an increase rate of +4° C./min from 300° C., an apparent viscosity was measured and used as the melt viscosity. For a resin composition containing the wholly aromatic thermotropic liquid-crystal polyester (I) the apparent viscosity at 370° C., and for a resin composition containing the wholly aromatic thermotropic liquid-crystal polyester (II) the apparent viscosity at 340° C. were determined and used as the melt viscosities. Prior to the measurements, the resin compositions were dried in advance in a vacuum dryer at 150° C. for 4 hours.

(Evaluation of Productivity)

The productivities concerning wholly aromatic thermotropic liquid-crystal polyester resin compositions in Examples and Comparative Examples were evaluated according to the following criteria. The results are shown in Table 1.

◯: Pellets were yielded.

x: Compounding was so difficult that pellets were not yielded.

Measurements of the light reflectance and evaluation tests of the blistering with respect to the respective test specimens prepared as above were conducted. The results are shown in Table 1. In this regard, for Comparative Example 3 and 4, in which pellets were not yielded, the evaluation tests were not conducted.

(Measurement of Light Reflectance)

The diffuse reflectance of a surface with respect to the respective test specimens was measured by using a self-recording spectrophotometer ("U-3500", manufactured by Hitachi High-Technologies Corp.) with respect to light of wavelengths of 480 nm and 420 nm. The light reflectance is expressed as a relative value with respect to 100% for the diffuse reflectance of a standard white board of barium sulfate. The results are shown in Table 1.

(Evaluation Test of Blistering)

The respective prepared test specimens were heat-treated for 30 min in an oven with an internal environment at a temperature of 260° C. The heat-treated test specimens were taken out and existence or nonexistence of blistering and swelling was inspected visually. The results are shown in Table 1, where ○ means: no abnormality found, and x means: abnormality found.

TABLE 1

| | Wholly aromatic thermotropic liquid-crystal polyester (Parts by volume) | | Titanium oxide particle (Parts by volume) | Barium sulfate particle (Parts by volume) | | Glass fiber (Parts by volume) | Light reflectance (%) | | Melt viscosity (Pa · s) | Blistering property | Productivity |
|---|---|---|---|---|---|---|---|---|---|---|---|
| | (I) | (II) | | (I) | (II) | | 420 nm | 480 nm | | | |
| Example 1 | 100 | | 12.5 | 12.5 | | | 81.0 | 86.5 | 120 | ○ | ○ |
| Example 2 | 100 | | 7.1 | 37.5 | | | 78.0 | 85.0 | 260 | ○ | ○ |
| Example 3 | 100 | | 37.5 | 7.1 | | | 82.0 | 87.0 | 160 | ○ | ○ |
| Example 4 | 100 | | 12.5 | | 12.5 | | 80.5 | 86.5 | 100 | ○ | ○ |
| Example 5 | 100 | | 14.3 | 14.3 | | 14.3 | 73.0 | 85.0 | 160 | ○ | ○ |
| Example 6 | | 100 | 7.1 | 35.7 | | | 81.5 | 87.5 | 200 | ○ | ○ |
| Example 7 | | 100 | 35.7 | 7.1 | | | 82.5 | 88.5 | 170 | ○ | ○ |
| Comparative Example 1 | 100 | | 42.9 | | | | 68.0 | 78.0 | 380 | X | ○ |
| Comparative Example 2 | 100 | | | 42.9 | | | 66.0 | 79.0 | 340 | X | ○ |
| Comparative Example 3 | 100 | | 50 | 8.3 | | 8.3 | — | — | 450 | — | X |
| Comparative Example 4 | 100 | | 16.7 | 50 | | | — | — | 430 | — | X |
| Comparative Example 5 | 100 | | | | | 23.5 | 45.0 | 55.0 | 80 | ○ | ○ |

INDUSTRIAL APPLICABILITY

The present invention can provide, without compromising the superior heat resistance and moldability of a wholly aromatic thermotropic liquid-crystal polyester, a resin composition yielding a molded object having superior light reflectance and mechanical strength. By injection-molding the resin composition and using a surface of the injection-molded object as a reflection surface, a reflector superior in light reflectance and heat resistance, especially a reflector superior in light reflectance for light of short wavelength, suitable for a white LED can be produced.

The invention claimed is:

1. A wholly aromatic thermotropic liquid-crystal polyester resin composition comprising;
    5 to 40 parts by volume of titanium oxide (B) and 5 to 40 parts by volume of barium sulfate (C) with respect to 100 parts by volume of a wholly aromatic thermotropic liquid-crystal polyester (A);
    wherein the total of the (B) component and the (C) component with respect to 100 parts by volume of the (A) component is 15 to 45 parts by volume.

2. A wholly aromatic thermotropic liquid-crystal polyester resin composition comprising:
    5 to 40 parts by volume of titanium oxide (B), 5 to 40 parts by volume of barium sulfate (C), and 1 to 15 parts by volume of glass fiber (D) with respect to 100 parts by volume of a wholly aromatic thermotropic liquid-crystal polyester (A);
    wherein a total of the (B) component, the (C) component, and (D) component with respect to 100 parts by volume of the (A) component is 15 to 45 parts by volume.

3. The wholly aromatic thermotropic liquid-crystal polyester resin composition according to claim 2, wherein a fiber length of the (D) component is in a range of 0.1 to 3 mm.

4. The wholly aromatic thermotropic liquid-crystal polyester resin composition according to claim 1, wherein a primary particle size of the (B) component is in a range of 0.2 to 0.3 μm, and a primary particle size of the (C) component is in a range of 0.1 to 10 μm.

5. The wholly aromatic thermotropic liquid-crystal polyester resin composition according to claim 1, wherein a melting point of the (A) component is 320° C. or higher.

6. The wholly aromatic thermotropic liquid-crystal polyester resin composition according to claim 1, wherein a light reflectance with respect to light of a 420 nm wavelength at a molded surface of an injection-molded object thereof is 70% or higher.

7. A molded object of the wholly aromatic thermotropic liquid-crystal polyester resin composition according to claim 1.

8. An LED reflector comprising the wholly aromatic thermotropic liquid-crystal polyester resin composition according to claim 1.

9. A wholly aromatic thermotropic liquid-crystal polyester resin composition for molding an LED reflector, the composition comprising:
    5 to 40 parts by volume of titanium oxide (B), 5 to 40 parts by volume of barium sulfate (C), and 1 to 15 parts by volume of glass fiber (D) with respect to 100 parts by volume of a wholly aromatic thermotropic liquid-crystal polyester (A);
    wherein the total of the (B) component, the (C) component, and the (D) component with respect to 100 parts by volume of the (A) component is 15 to 45 parts by volume;
    a primary particle size of the (B) component is in a range of 0.2 to 0.3 μm, a primary particle size of the (C) component is in a range of 0.1 to 10 μm, and a fiber length of the (D) component is in a range of 0.1 to 3 mm; and a light reflectance with respect to light of a 420 nm wavelength at a molded surface of an injection-molded object thereof is 70% or higher.

10. The wholly aromatic thermotropic liquid-crystal polyester resin composition for molding an LED reflector according to claim 9, wherein a melting point of the (A) component is 320° C. or higher.

11. An LED reflector comprising the wholly aromatic thermotropic liquid-crystal polyester resin composition for molding an LED reflector according to claim 9.

12. The wholly aromatic thermotropic liquid-crystal polyester resin composition according to claim 2, wherein a primary particle size of the (B) component is in a range of 0.2 to 0.3 μm, and a primary particle size of the (C) component is in a range of 0.1 to 10 μm.

13. The wholly aromatic thermotropic liquid-crystal polyester resin composition according to claim 2, wherein a melting point of the (A) component is 320° C. or higher.

14. The wholly aromatic thermotropic liquid-crystal polyester resin composition according to claim 2, wherein a light reflectance with respect to light of a 420 nm wavelength at a molded surface of an injection-molded object thereof is 70% or higher.

15. A molded object of the wholly aromatic thermotropic liquid-crystal polyester resin composition according to claim 2.

16. An LED reflector comprising the wholly aromatic thermotropic liquid-crystal polyester resin composition according to claim 2.

* * * * *